United States Patent
Hartmann

(10) Patent No.: US 7,407,111 B2
(45) Date of Patent: Aug. 5, 2008

(54) SURFACE ACOUSTIC WAVE IDENTIFICATION TAG HAVING ENHANCED DATA CONTENT AND METHODS OF OPERATION AND MANUFACTURE THEREOF

(75) Inventor: Clinton S. Hartmann, Dallas, TX (US)

(73) Assignee: RF Saw Components, Inc., Richardson, TX (US)

( * ) Notice: Subject to any disclaimer, the term of this patent is extended or adjusted under 35 U.S.C. 154(b) by 0 days.

(21) Appl. No.: 11/182,385

(22) Filed: Jul. 15, 2005

(65) Prior Publication Data

US 2005/0264423 A1 Dec. 1, 2005

Related U.S. Application Data

(63) Continuation of application No. 10/024,624, filed on Dec. 18, 2001, now Pat. No. 6,966,493.

(51) Int. Cl.
*G06K 19/06* (2006.01)
(52) U.S. Cl. .......................... 235/492; 235/375; 235/451
(58) Field of Classification Search ................. 235/375, 235/492, 451
See application file for complete search history.

(56) References Cited

U.S. PATENT DOCUMENTS

| | | | |
|---|---|---|---|
| 4,625,208 A | 11/1986 | Skeie et al. | |
| 4,737,790 A | 4/1988 | Skeie et al. | |
| 6,121,892 A | 9/2000 | Reindl et al. | |
| 6,208,062 B1 | 3/2001 | Nysen et al. | |
| 6,455,979 B2 * | 9/2002 | Reindl et al. | 310/313 D |
| 6,630,900 B2 | 10/2003 | Stierlin et al. | |
| 6,633,226 B1 | 10/2003 | Nysen | |
| 6,708,881 B2 | 3/2004 | Hartmann | |
| 6,966,493 B2 * | 11/2005 | Hartmann | 235/454 |
| 2002/0017617 A1 | 2/2002 | Schuth et al. | |
| 2003/0090664 A1 | 5/2003 | Amonette et al. | |
| 2005/0264423 A1 * | 12/2005 | Hartmann | 340/572.8 |

FOREIGN PATENT DOCUMENTS

DE 196 22 154 A1 10/1995
WO PCT/AU89/00470 5/1990

OTHER PUBLICATIONS

Parent case U.S. Appl. No. 10/024,624, filed Dec. 18, 2001; entitled "Surface Acoustic Wave Identification Tag Having Enhanced Data Content and Methods of Operation and Manufacture Thereof"; to Clinton S. Hartmann; currently allowed on May 26, 2005.

* cited by examiner

*Primary Examiner*—Ahshik Kim

(57) ABSTRACT

A surface acoustic wave (SAW) identification tag and methods of operating and manufacturing the tag. In one embodiment, the tag includes: (1) a piezoelectric substrate having a SAW transducer located thereon, (2) a group of slots arranged by both pulse position and phase position on said substrate; and (3) a number of reflectors distributed among the slots such that the reflectors encode a number by both pulse position and phase position.

37 Claims, 15 Drawing Sheets

FIG. 11

| STATE | 0 | 1 | 2 | 3 | 4 | 5 | 6 | 7 | 8 | 9 |
|---|---|---|---|---|---|---|---|---|---|---|
| 0 | X |   |   | Y |   |   |   |   |   |   |
| 1 | X |   |   |   |   | Y |   |   |   |   |
| 2 | X |   |   |   |   |   |   | Y |   |   |
| 3 | X |   |   |   |   |   |   |   |   | Y |
| 4 |   | X |   | Y |   |   |   |   |   |   |
| 5 |   | X |   |   |   |   | Y |   |   |   |
| 6 |   | X |   |   |   |   |   |   | Y |   |
| 7 |   |   | X |   | Y |   |   |   |   |   |
| 8 |   |   | X |   |   |   |   | Y |   |   |
| 9 |   |   | X |   |   |   |   |   |   | Y |
| 10 |   |   |   | X |   |   | Y |   |   |   |
| 11 |   |   |   | X |   |   |   |   | Y |   |
| 12 |   |   |   |   | X |   | Y |   |   |   |
| 13 |   |   |   |   | X |   |   |   |   | Y |
| 14 |   |   |   |   |   | X |   | Y |   |   |
| 15 |   |   |   |   |   |   | X |   |   | Y |

A: IN-PHASE SUB-GROUP

FIG.12A

| STATE | 0 | 1 | 2 | 3 | 4 | 5 | 6 | 7 | 8 | 9 |
|---|---|---|---|---|---|---|---|---|---|---|
| 0 | X |   |   | Y |   |   |   |   |   |   |
| 1 | X |   |   |   |   | Y |   |   |   |   |
| 2 | X |   |   |   |   |   |   | Y |   |   |
| 3 | X |   |   |   |   |   |   |   |   | Y |
| 4 |   | X |   |   | Y |   |   |   |   |   |
| 5 |   | X |   |   |   |   | Y |   |   |   |
| 6 |   | X |   |   |   |   |   |   | Y |   |
| 7 |   |   | X |   |   | Y |   |   |   |   |
| 8 |   |   | X |   |   |   |   | Y |   |   |
| 9 |   |   | X |   |   |   |   |   |   | Y |
| 10 |   |   |   | X |   |   | Y |   |   |   |
| 11 |   |   |   | X |   |   |   |   | Y |   |
| 12 |   |   |   |   | X |   | Y |   |   |   |
| 13 |   |   |   |   | X |   |   |   |   | Y |
| 14 |   |   |   |   |   | X |   | Y |   |   |
| 15 |   |   |   |   |   |   | X |   |   | Y |

B: QUADRATURE PHASE SUB-GROUP

FIG.12B

IN 10 SLOTS, TWO REFLECTORS WITH MINIMUM SPACING OF 2 SLOTS HAVE 36 POSSIBLE PLACEMENTS

| STATE | 0 | 1 | 2 | 3 | 4 | 5 | 6 | 7 | 8 | 9 |
|---|---|---|---|---|---|---|---|---|---|---|
| 0  | X |   | Y |   |   |   |   |   |   |   |
| 1  | X |   |   | Y |   |   |   |   |   |   |
| 2  | X |   |   |   | Y |   |   |   |   |   |
| 3  | X |   |   |   |   | Y |   |   |   |   |
| 4  | X |   |   |   |   |   | Y |   |   |   |
| 5  | X |   |   |   |   |   |   | Y |   |   |
| 6  | X |   |   |   |   |   |   |   | Y |   |
| 7  | X |   |   |   |   |   |   |   |   | Y |
| 8  |   | X | Y |   |   |   |   |   |   |   |
| 9  |   | X |   | Y |   |   |   |   |   |   |
| 10 |   | X |   |   | Y |   |   |   |   |   |
| 11 |   | X |   |   |   | Y |   |   |   |   |
| 12 |   | X |   |   |   |   | Y |   |   |   |
| 13 |   | X |   |   |   |   |   | Y |   |   |
| 14 |   | X |   |   |   |   |   |   | Y |   |
| 15 |   |   | X | Y |   |   |   |   |   |   |
| 16 |   |   | X |   | Y |   |   |   |   |   |
| 17 |   |   | X |   |   | Y |   |   |   |   |
| 18 |   |   | X |   |   |   | Y |   |   |   |
| 19 |   |   | X |   |   |   |   | Y |   |   |
| 20 |   |   | X |   |   |   |   |   |   | Y |
| 21 |   |   |   | X | Y |   |   |   |   |   |
| 22 |   |   |   | X |   | Y |   |   |   |   |
| 23 |   |   |   | X |   |   | Y |   |   |   |
| 24 |   |   |   | X |   |   |   | Y |   |   |
| 25 |   |   |   | X |   |   |   |   |   | Y |
| 26 |   |   |   |   | X | Y |   |   |   |   |
| 27 |   |   |   |   | X |   | Y |   |   |   |
| 28 |   |   |   |   | X |   |   | Y |   |   |
| 29 |   |   |   |   | X |   |   |   |   | Y |
| 30 |   |   |   |   |   | X | Y |   |   |   |
| 31 |   |   |   |   |   | X |   | Y |   |   |
| 32 |   |   |   |   |   | X |   |   |   | Y |
| 33 |   |   |   |   |   |   | X | Y |   |   |
| 34 |   |   |   |   |   |   | X |   |   | Y |
| 35 |   |   |   |   |   |   |   | X |   | Y |

FIG.13

SURFACE ACOUSTIC WAVE IDENTIFICATION TAG HAVING ENHANCED DATA CONTENT AND METHODS OF OPERATION AND MANUFACTURE THEREOF

This Application is a Continuation of application Ser. No. 10/024,624 filed on Dec. 18, 2001, currently U.S. Pat. No. 6,966,493, commonly assigned with the present invention and incorporated herein by reference as if reproduced in its entirety under Rule 1.53(b).

TECHNICAL FIELD OF THE INVENTION

The present invention is directed, in general, to identification tags and, more specifically, to a surface acoustic wave (SAW) identification tag having enhanced data content and methods of operating and manufacturing the same.

BACKGROUND OF THE INVENTION

Modern technology has produced a number of useful electronic identification methods and devices. Most familiar are the ubiquitous bar codes and magnetic strips that, together with their readers, are widely employed by businesses and others to perform several identification functions. The main reason bar codes and magnetic strips are so widely used is that they are very cheap.

Bar codes and magnetic strips are limited, however, by the relatively small amount of data they can encode and the effective range at which they can be read, which is quite short. Magnetic strips, for example, generally have such a limited range that the reader must be in direct contact with the strip in order to decode the data thereon. In the very few cases where a magnetic strip is read with a device other than a direct contact reader, the effective reading range is still only a few centimeters at best. Similarly, the effective range at which bar codes can be reliably read is typically no better than a few centimeters.

In addition to range limitations, both bar codes and magnetic strips are impossible to read if there is any obstruction between the reading device and the bar code or magnetic strip. When reading a magnetic strip or bar code, the orientation of the reading device relative to the bar code or magnetic strip also presents a problem. If the reading device is not properly aligned or is held at an incorrect angle, the encoded information can not be read. As a result of these problems, each individual read operation requires manual scanning by a human operator if high read accuracy is needed. The attractive feature of bar codes and magnetic strips is that they are inexpensive. However, their inherent limitations have prevented their use in a wide range of applications for machine readable tags where highly reliable and totally automated reading is required for read ranges of up to several meters.

The radio frequency identification ("RFID") tag is another prior art type of identification device. When interrogated, RFID tags reflect or retransmit a radio frequency signal to return an encoded identification number to the interrogator. A good example of RFID tags is their usage in the collection of highway and bridge tolls. An RFID tag is positioned on a user's vehicle to respond to an interrogation signal when the vehicle passes through a toll collection point. A reading device connected to a computer processes the tag identification number and uses the decoded information to charge a toll to the user by deducting the amount due from the user's credit card or other account.

Prior art RFID tag devices are of two basic types; those that contain a microchip and those that do not. There is a radical difference in cost and performance between these two types; to such an extent, in fact, that they rarely compete with one another as to the appropriate type of use. As a general rule, chip tags cost more but have a larger data capacity than chipless tags. Chip tags, for example, are usually not available below a unit cost of about one dollar each when ordered in a quantity of less than one million; whereas many chipless tags are projected to cost less than 20 cents each, even when manufactured in quantities of one hundred thousand.

Most RFID tags will have a longer reliable range than magnetic strips and bar codes. As a rule, RFID tags can be interrogated without having as significant line-of-sight and orientation problems as are evidenced by bar codes and magnetic strips. Although chip tags do have a longer range than magnetic strip and bar code systems, the range at which they can be reliably used is still a limiting factor.

Chip tags are by far the most popular. A chip tag consists of four elements or features: (1) a computer microchip; (2) circuits for converting radio signals to computer data signals and back to radio signals; (3) an antenna; and (4) a means for providing DC power to the chip circuitry. In low cost RFID chip tags, the first two features are often partially or totally integrated into a single microchip, which integration requires certain compromises in tag performance (read range, number of bits, etc.). This combination of features also leads to certain integrated circuit (IC) cost and/or design compromises to accommodate both digital and radio frequency circuitry on a single IC. The impact of these design compromises can be partially compensated for by use of low radio frequency (RF) operating frequencies that, in turn, lead to rather large and expensive antennas.

The most daunting problem with chip tags is the need for DC power for the chip circuitry. The combination of environmental issues coupled with severe constraints on cost, size and weight usually requires that the tag not have a battery or other on-board power source. The only generally useable solution is to obtain DC power by converting RF power received from the tag reader signal into DC power within the tag. Those skilled in the pertinent art term tags without a battery or other power source as "passive" tags, while those that contain a battery or other source are termed as "active" tags. The passive method of providing DC power to a chip tag requires a more efficient tag antenna (i.e., larger size and cost) and higher transmitted power levels from the reader. It also requires added components which will either add to the cost of the microchip or to the cost of the tag for the required extra electrical components in the tag, which will also result in an increased tag size. The most important limitation of passive powered chip tags, however, is the severe restriction on the read range of the tag because a signal that is sufficiently strong to power the tag only extends a short distance from the tag reader antenna. Thus, while chip tags have the dominate share of the RFID market, the high cost and limited read range combine to prevent chip tags from replacing either bar codes or magnetic strips in any significant manner.

"Chipless" RFID tags do not contain a microchip but, instead, rely on magnetic materials or transistorless thin film circuits to store data. A major advantage of chipless RFID tags is their relatively low cost. The disadvantages of chipless tags include that they are range limited (several centimeters at the most) and only contain limited amounts of information. The severity of these problems has prevented their market acceptance in spite of their low cost potential.

In the year 2000, the current global market for conventional RFID systems and services is in the order of 500 million U.S.

dollars. This market is largely for chip tags that typically cost from about one dollar to tens of dollars each. While chipless tags are not selling well, they have generated great interest from a number of potential users because of their low cost potential. A huge gap exists in the automatic identification market between the very low cost bar codes and the higher performing RFID chip tags. The overall market is clamoring for a technical solution to fill that gap. The critical characteristics of the new automatic identification technology to fill this gap are: (1) a cost of between one cent and ten cents per tag when manufactured in high quantities; (2) reliable reading without the need for manual scanning by a human operator; (3) reliable reading without a line of sight between the tag and tag reader (i.e., reliable reading even if the tag is scratched, or covered with dirt, or on the wrong side of the package, etc.); (4) a reliable read range of at least one to two meters; and (5) a tag data capacity of roughly 100 bits. Such tags are of vital interest to postal authorities, airlines and airports, mass transit authorities, animal breeders, the livestock industry, delivery businesses, any business with significant supply chains, particularly those that maintain inventory or handle fast moving consumer goods, and so on. These are all applications where a high priced tag is not practicable, particularly where the tag is disposable or is going to be sold with the product.

Accordingly, what is needed in the art is a reliable, economically priced, small identification tag upon which can be encoded substantial identification data that can be read at an adequate range and can be used in a variety of environments and for a variety of applications.

SUMMARY OF THE INVENTION

To address the above-discussed deficiencies of the prior art, the present invention provides a surface acoustic wave (SAW) identification tag and methods of operating and manufacturing the tag. In one embodiment, the tag includes: (1) a piezoelectric substrate having a SAW transducer located thereon, (2) a group of slots arranged by both pulse position and phase position on said substrate; and (3) a number of reflectors distributed among the slots such that the reflectors encode a number by both pulse position and phase position.

The present invention therefore introduces the broad concept of employing both phase and pulse position modulation and/or the use of multiple pulse combinations to dramatically increase the amount of data that a SAW identification tag can contain. Such increase allows tags to contain substantial data, e.g., globally unique numbers, which allows the tags to be used to identify and track an unprecedented number of objects uniquely and reliably.

In one embodiment of the present invention, the reflectors are arranged wherein the phase position is in quadrature. In an embodiment to be illustrated and described, the phase arrangement of the slots effects phase modulation, which is in part responsible for the data-carrying capacity of tags constructed in accordance with the principles of the present invention.

In another embodiment of the present invention, the identification tag further includes a framing reflector located between the transducer and the group. This framing reflector may be regarded as a start reflector. In an embodiment to be described and illustrated an additional end reflector and the start reflector serve to frame the groups of reflectors that actually encode the number.

In still another embodiment of the invention, the SAW identification tag is further comprised of a plurality of groups separated by dead spaces. The dead spaces, while not necessary to the present invention, separate the groups so as to decrease interactions which may cause excessive inter-symbol interference.

In one embodiment of the present invention, the tag encodes a number that is at least eight bits long. In still another embodiment the tag has a plurality of at least four groups that provide for a number that is at least 32 bits long. In a particularly beneficial embodiment, the tag has a plurality of at least twelve groups and encodes a number which is at least 96 bits long.

In yet another embodiment of the present invention, the transducer is configured to produce a SAW having a frequency of between two and three gigahertz. A useful aspect of this embodiment provides for the transducer to produce a SAW having a frequency of about 2.45 gigahertz.

In still yet another embodiment of the invention, at least reflectors are single strips of conductive material. The reflectors may alternatively be multiple strips coupled together to act as a single reflector, or may be of any shape that is suitable to a particular application.

A particularly beneficial embodiment of the present invention provides for the tag to have a globally unique number, thus permitting the unique global identification of a large number of objects. This unique numbering capability advantageously effects object (or asset) tracking, and, when coupled with the ability to encode very large numbers, effects a global object tracking system.

In one embodiment of the present invention, the number contains data pertaining to an object associated with the tag. Thus, the tag is advantageously affixed to an object, which may be a machine part, a package, supply part, inventory item, another identification tag, animal or any other type or category of object that can be grouped or classified.

In another embodiment of the invention, the number includes an error detection portion. The error detection portion may further be capable of error correction to at least some extent. Of course, error detection or correction is not required in the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 11 illustrates a table showing the 286 possible states that exist when three reflectors are used in a group of 21 Slots having a skip factor of four;

FIG. 12 illustrates tables showing two sub-groups of states from a SAW RFID tag with four reflectors per group, 20 slots per group, a phase increment between adjacent slots ±90° with division into two interleaved sub-groups of ten slots each;

FIG. 13 illustrates a table showing the states for a SAW RFID tag with 10 slots, two reflectors and 36 possible placements;

DETAILED DESCRIPTION

Figure 1:
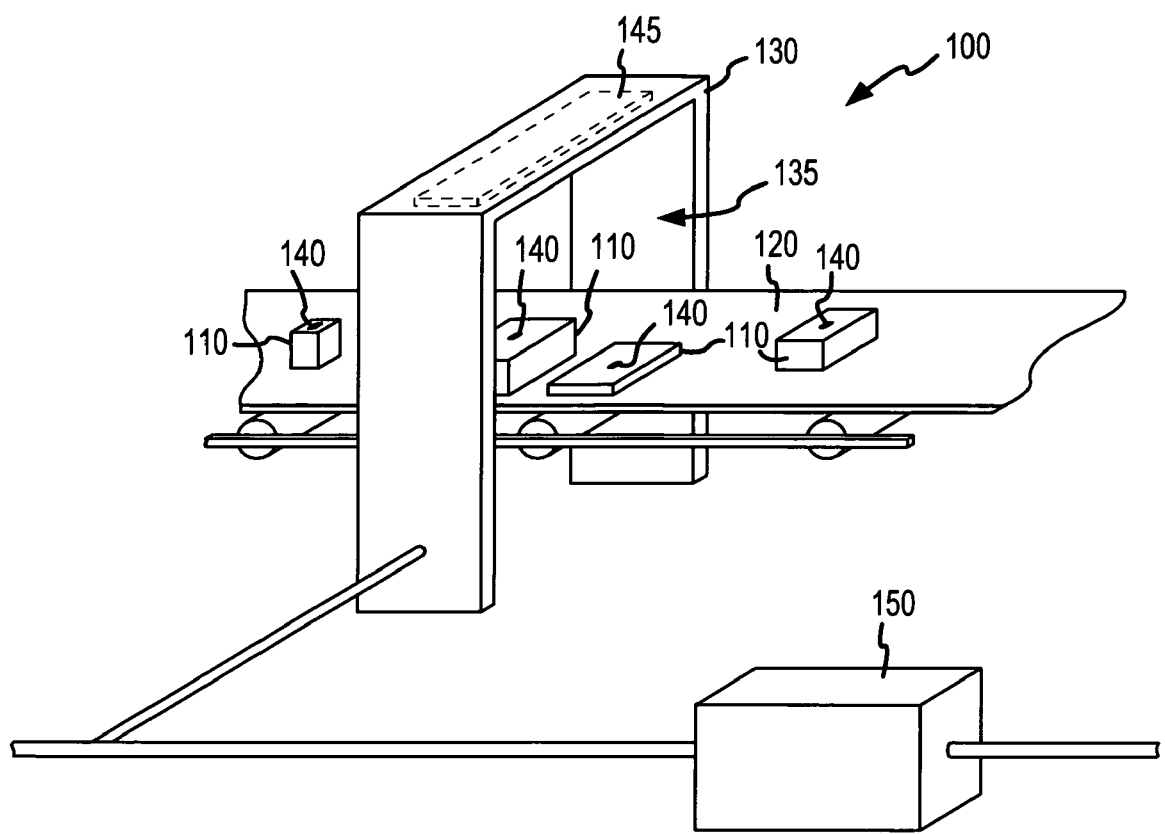
FIG. 1 illustrates an isometric side view of a parcel sorting and identification machine employing an embodiment of the present invention to identify parcels as they are carried on a conveyor belt through a reader incorporated in the machine.

Referring initially to FIG. 1, illustrated is an isometric side view of a parcel sorting and identification machine 100 employing an embodiment of the present invention to identify parcels 110 as they are carried on a conveyor belt 120 through a reader 130 incorporated in the machine 100. This machine 100 is representative of the kind of machine 100 the present invention makes available to a large number of businesses having a need to identify objects with particularity and is illustrated in order to demonstrate certain useful aspects of the present invention. Those of ordinary skill in the art will understand that a seemingly endless number of machine 100 configurations can be used to incorporate readers 130 that can utilize the present invention. SAW identification tag 140 readers 130 for interrogating and decoding SAW identification tag 140 responses are described in detail in U.S. Pat. No. 6,708, 881, issued on Mar. 23, 2004, entitled "Reader for a High Information Capacity SAW Identification Tag and Method of Use Thereof," by Hartmann, which commonly assigned with the invention and incorporated herein by reference.

There are number of historical business applications where object identification with specific particularity has always been required. The transportation industry, for example, has always had to identify each luggage and freight item with particularity from origin to destination. Other such businesses include overnight delivery services; package delivery services; mail order catalog stores; and even the cattle industry, where each cow is tracked from birth to the time it is delivered to the slaughter house. The methods used by these businesses have ranged from placing labels or brands on the objects that enable the object to be visually identified to using some form of an existing prior art identification tag system. The inexpensive SAW identification tags 140 described herein will revolutionize traditional identification and tracking systems. The SAW identification tags 140 covered by this invention have sufficient data capacity and a reliable enough read range to supplant most prior art identification systems. The present invention will enable traditional businesses required to globally identify and track objects with particularity to do so more economically and more efficiently.

Not only will businesses currently using, or having a readily identifiable need to use, some form of identification tag find the invention described herein particularly useful, but the low cost, high data capacity and longer reliable read range will empower other businesses to find uses for SAW identification tags 140, only some of which can be anticipated. For example, because SAW identification tags 140 can be made so cheaply while still being able to contain large amounts of data, it will become economical for a grocery store to track individual inventory items, such as a specific can of soup or a specific loaf of bread. By making this information available to its suppliers (by using the Internet, for instance), such suppliers will be able to more efficiently keep the store's shelves stocked by replacing items sold or removing items that become outdated.

There are, of course, several yet to be identified business and other applications that will find the present invention useful, all of which are within the intended scope of the present invention. An imaginative use of the present invention would call for a SAW identification tag 140 to be placed on another identification tag, whether such other tag is a SAW identification tag 140, a prior art tag, or a subsequently invented tag. This use would be appropriate, for example, where a very expensive identification tag is used to identify a shipping container and it is necessary to return the tag to the shipper or verify that the container tag is genuine.

Returning now to FIG. 1, assume the illustrated machine 100 is being used by a parcel delivery company that is in the business of receiving a parcel from a shipper in one city and delivering it to a recipient in another city. Assume further that the machine 100 is but one of a number of such similar machines 100 being used by the delivery business within its system of terminals, collection points and delivery vehicles.

Located on or inside each parcel 110 within the company's delivery system will be a SAW identification tag 140 that is constructed and operated in accordance with the invention described herein. At each point in the system as a parcel 110 passes through a window 135 in a machine 100, an interrogator 145 in a reader 130 mounted on the machine 100 transmits a radio frequency interrogation signal that excites the SAW identification tag 140 on or within the parcel 110. The SAW identification tag 140 then responds to the interrogation signal, which response is detected by the reader 130. The reader 130 then decodes the response to obtain the identification number for the particular parcel 110.

Those of ordinary skill in the pertinent art will understand that systems using SAW identification tags 140 of the type described herein will have unique features. For example, the system illustrated in FIG. 1 will most likely require a reader 130 to have an interrogator 145 with a reading field that spans the width of the conveyor belt 120 in order to identify each parcel 110, regardless of its position or orientation on the belt 120 as it passes through the window 135. In order to handle different sizes of parcels 110, the reader window 135 must also be large enough to permit all sizes of parcels 110 to easily pass through. This also means that the reader 130 and tag 140 combination must have sufficient range so the reader 130 can reliably read the SAW identification tag 140 on a parcel 110 most distant from the reader 130.

In a delivery system such as that being assumed herein, it is important that information about a parcel 110 be made widely available after it is identified. In order to disseminate such information the illustrated machine 100 is coupled to a computer 150, that is but one of a number of computers 150 in a network (hereinafter described). Because the parcel 110 identification information is available on the network, a number of decisions and actions can be taken with respect to the parcel 110, such as furnishing tracking information about the parcel 110 to the shipper; routing the parcel 110 for delivery via another carrier; designating the parcel 110 for loading on a vehicle for delivery; and so on.

Figure 2:
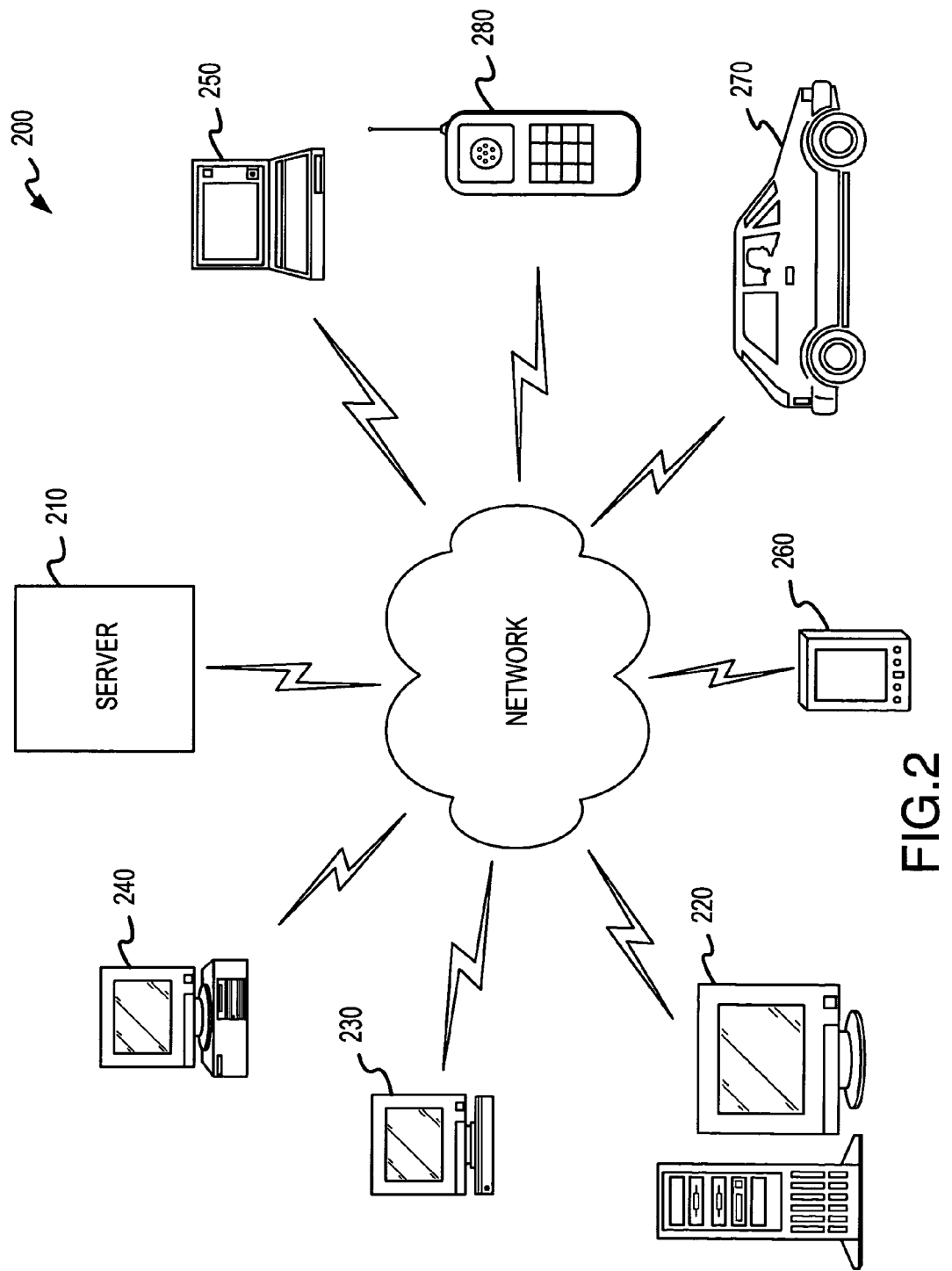
FIG. 2 illustrates a block diagram of an embodiment of a computer or communications network of a type that could be usefully employed with the present invention.

Turning now to FIG. 2, illustrated is a block diagram of an embodiment of a computer or communications network 200 that could be usefully employed with the present invention. The network 200 could be a Local Area Network ("LAN"), a Wide Area Network ("WAN"), an intranet, an extranet, the Internet, a generalized internet, any combination thereof, and many others. For clarification purposes, as used herein an intranet is a private network contained within an enterprise (such as a parcel delivery business with multiple offices) and may consist of interlinked LANs and leased lines in a WAN. Typically, an intranet also includes connections through one or more gateway computers (not shown) to the Internet. The main purpose of an intranet is to share information and computing resources and, in some instances, to facilitate working in groups. For example, a delivery company may keep certain information about a parcel 110 within its intranet system for its own use but permit access to information about parcels, such as tracking information, to its customers over the Internet.

Another example of how the present invention can be usefully employed using a computer or communications network 200 would be a business such as a grocery or hardware store. Because each item in the store would have a SAW identification tag 140 associated with it, as an item is sold information about the sale is entered into the store's computer that is connected to a network 200. If the store's suppliers have access to the network (perhaps via the Internet), such suppliers can monitor inventory and restock sold items or remove items that become outdated or that are not selling. Similarly, a wide range of interested parties can simultaneously achieve benefits from access to this data.

Within the typical computer network 200 environment will be a server 210 that includes at least one database for receiving requests, performing specific tasks, and retrieving and updating information, such as, in the instant case, activity with respect to items identified by SAW identification tags 140. The computer network 200 most probably will include one or more of a variety of conventional interface devices, such as personal computers 220, conventional workstations 230, conventional office computer systems 240 and conventional laptop computers 250. In addition to conventional interface devices, a computer network 200 can also include personal digital assistants 260 and individually addressable vehicles ("IAV"). An IAV 270 can be any instrument capable of certain computer functions that is combined with a wireless receiver and/or transmitter and is individually addressable. For example, a delivery vehicle or a baggage handler can have a terminal that is an IAV 270.

Figure 3:
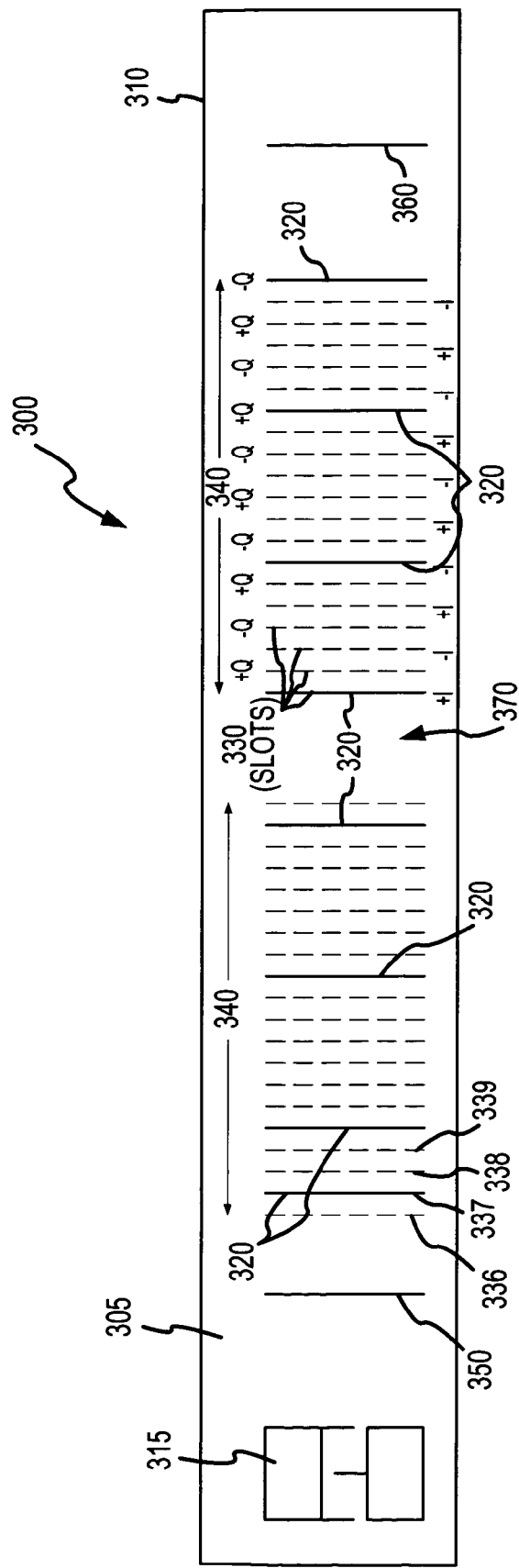
FIG. 3 illustrates a plan view of a top surface of an embodiment of a SAW identification tag constructed in accordance with the present invention.

Turning now to FIG. 3, illustrated is a plan view of a top surface 305 of an embodiment of a SAW identification tag 300 constructed in accordance with the present invention. The SAW identification tag 300 has a substrate 310 with well known piezoelectric characteristics. Located at one end of the surface 305 of the substrate 310 is a transducer 315. When the transducer 315 is electrically connected to a means for obtaining an interrogation signal from a reader (e.g. via an antenna), a signal having a known frequency and amplitude is generated that travels down the substrate 310 as a surface acoustic wave or SAW. In one embodiment of the invention, the transducer 315 is configured to produce a SAW having a frequency of between two and three gigahertz. A particularly useful aspect of this embodiment is having the transducer configured to produce a SAW having a frequency of about 2.45 gigahertz within the internationally recognized ISM band. Of course, as those of ordinary skill in the pertinent art will understand, any frequency between about 400 MHz and 6 GHz will be within the intended scope of the present invention as will any other frequency used to produce a SAW.

Located on the surface 305 of the substrate 310 are reflectors 320 designed to reflect a portion of the SAW back to the transducer 315. The reflectors 320 are arranged to encode the reflected response with an identification number that can be decoded or demodulated. In one embodiment of the invention, the identification number is globally unique to the specific SAW identification tag 300.

In one embodiment of the present invention at least some of the reflectors 320 are single strips of conductive material. The reflectors 320 may alternatively be multiple strips of conductive material coupled together to act as a single reflector 320. As those of ordinary skill in the pertinent art will understand, the reflectors 320 may be isolated metal strips, electrically shorted metal strips, dielectric strips, semiconducting strips, surface deformations such as etched grooves, arrays of dots, or any of the foregoing items and numerous other structures, all of which are within the intended scope of the present invention as are any of the other various reflector 320 configurations that can be used.

When the transducer 315 generates a SAW signal, the SAW signal proceeds along the length of the substrate 310 until it encounters a reflector 320 and reflects a portion of the signal. The unreflected portion of the SAW signal continues along the substrate 305 and generates additional reflected signals from all succeeding reflectors 320 to create the complete modulated reflected response unique to that SAW identification tag 300. The transducer 315 converts this complete modulated reflected response back to an electrical signal that is returned to the reader by a suitable means (e.g. an antenna). This response is then decoded or demodulated to reveal the specific SAW identification tag 300 number.

To describe the arrangement of reflectors 320 on the substrate 305 it is helpful to consider relevant signal modulation methods. Using conventional pulse position modulation (PPM) a data stream can be coded by dividing it into separate sample values where a single pulse is used to transmit information contained in one sample. Changing the time position of that single pulse over a predetermined span of time serves to transmit the information in that sample. Single pulses in subsequent time spans are similarly used to transmit information in subsequent sample values.

Figure 4:
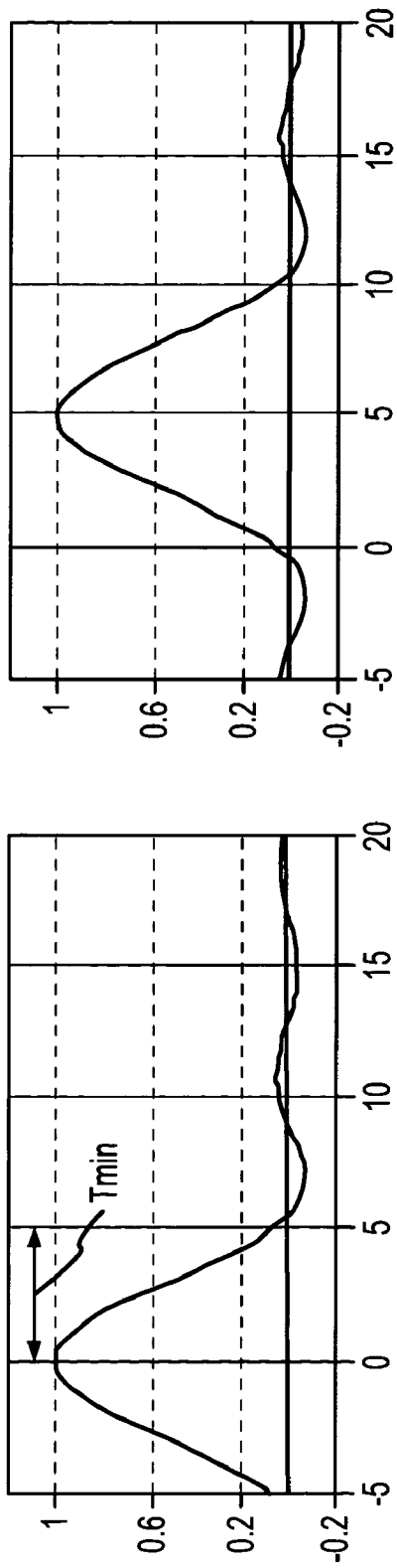
FIG. 4 illustrates an example of digital PPM showing four positions of a time span for transmitting data using conventional PPM
Figure 4:
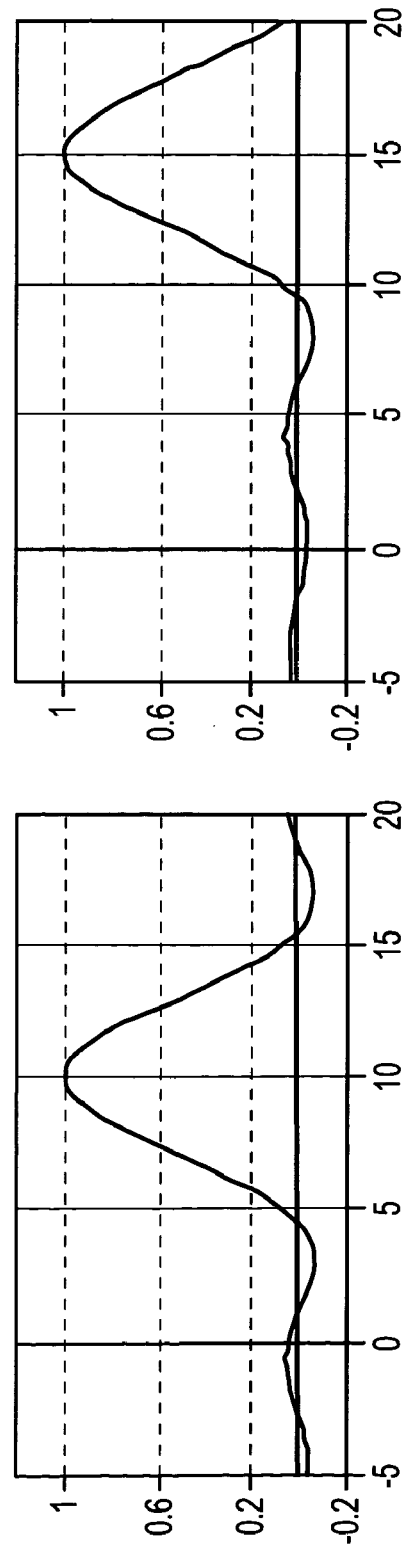

Turning now to FIG. 4, illustrated is an example of digital PPM showing four positions of a time span for transmitting data using conventional PPM. In this case, the sample to be transmitted is digital and has one of four possible values. Shown are the four possible waveforms which consist of nominally identical single pulse waveforms whose time positions can be centered in one of four time locations or pulse positions. The minimum time spacing required between pulse positions to ensure that skirts from neighboring pulse positions are essentially zero at the peak of any selected pulse is Tmin. Of course, pulse spacing wider than Tmin can be used without affecting the ability to demodulate a PPM signal, however, if pulse positions are spaced more closely than Tmin, it becomes more difficult to unambiguously distinguish one pulse position from its neighbor. Sampling the PPM waveform at each of the four possible peak pulse positions and selecting the largest one results in the demodulation of conventional PPM. It is readily apparent to those of ordinary skill in the relevant art that the demodulation process must be synchronized using one of a number of synchronization methods known in the art.

The four possible pulse positions represent two binary bits of data. A subsequent group of four pulse positions occupied by a single pulse can represent an additional two binary bits of data. As many sequential groups of four pulse positions as necessary can be used to represent a desired data word containing many bits of information.

PPM modulation is a favored modulation method for RFID tags based on SAW devices, because (1) a single pulse can be readily created and programmed by a SAW reflector placed on the SAW substrate, (2) the various pulse time positions directly relate to the spatial placement of possible SAW reflectors, (3) the number of data bits is greater than the number of signal pulses (which reduces tag insertion loss) and (4) the number of SAW reflectors remains constant for all possible tags identification numbers (which leads to reasonably low loss tags with uniform pulse amplitudes for any tag identification). However, the use of PPM for SAW RFID tags also has limitations. These limitations include: (1) PPM data density is low (which increases chip size and cost); (2) the low data density combined with practical maximum sizes for SAW chips creates an upper limit on the number of bits for practical tags; and (3) multi-bounce reflections between the various reflectors in a PPM SAW tag create unwanted pulses that can interfere with later parts of the PPM pulse train. The present invention overcomes these and other problems.

For clarification purposes, as hereinafter used the term "slot" (shown in FIG. 3) refers to certain spatial locations on a substrate 315 where a suitably placed reflector 320 will interact in a predetermined manner with a SAW generated by the transducer 315. Each slot is a location where a reflector 320 may be placed as part of encoding some data element. Usually, each slot has a unique SAW propagation delay with respect the transducer 315. Slots are often be described as "time slots" since a one-to-one correspondence exists between the spatial position and time position using a predetermined set of rules. When a reflector 315 is placed in a specific slot, a pulse of reflected SAW energy is created when the entire device is subjected to a reading signal. As used herein, the term "group" (shown in FIG. 3) is used to designate a particular collection of slots that are treated together in encoding and decoding data elements by means of selective placement of one or more reflectors 320 in selected slots that comprise the group.

In FIG. 4, Tmin is defined as a slot representing a time length that is centered on any of the possible pulse positions. A group is represented by a collection of adjacent slots. The example in FIG. 4, shows one group with four states that represent two binary data bits. If four groups of four slots are used, 256 possible states (or combinations) can exist (4 states×4 states×4 states×4 states=256 states). This corresponds to eight bits of data (or four times more data than a single group). These 256 states (eight bits of data) occupy a total of 16 slots. If these 16 slots are combined into a single group and conventional PPM method is used, one pulse would occupy one of the 16 slots. The available 16 states (four bits of data) is significantly smaller than the 256 states that would result from using the same 16 slots in four separate groups with four slots each.

If conventional PPM concepts are set aside and multiple pulses are allowed in a single group the number of states is significantly increased. For example, if four pulses are allowed in a group of 16 slots, 1,820 states exist which is significantly more than the 256 states available by using the more conventional PPM of four groups of four slots (which would occupy the same 16 slots). Further, if eight pulses are used in the group of 16 slots, 12,870 states are available, which is an even bigger improvement. If seven, eight, or nine pulses in a group of 16 slots are allowed, 35,750 states are possible, which corresponds to more than 15 bits of data (compared to the eight bits of data if conventional PPM was used in the same space).

Once multiple pulses are allowed in a single group, it is not proper to describe the modulation format as PPM. A more suitable name for this new method is multiple pulse per group keying (MPGK), where keying is the equivalent of modulation. MPGK has several variants.

MPGK includes: (1) partitioning a data stream to be transmitted into one or more separate sample values; (2) using more than one (i.e., multiple) pulse to transmit a given sample value; (3) transmitting the more than one pulse in a span of time that is divided into time slots which are nominally but not necessarily adjacent; (4) the collection of the time slots comprising the span of time constitute a group of slots and (5) distributing the multiple pulses among the group of slots in a predetermined maimer to represent the information contained in the separate sample value by a data mapping function and/or table. Groups can vary in the number of slots and/or in the number of occupied slots. All slots do not have to be identical (unequal slot widths, pulse amplitudes, etc., are allowed) nor do slots have to necessarily be adjacent to one another. A single group can be defined such that it only has a fixed number of occupied slots or, alternatively, it might allow for a varying number of occupied slots. A single data message could include more than one type of group (for example a header might be one type of group, the actual data a second type of group, and an error detection/correction word might be of a third type). All of these variants find particular utility in SAW RFID tags. Such variants are all within the scope of this invention.

Figure 5:
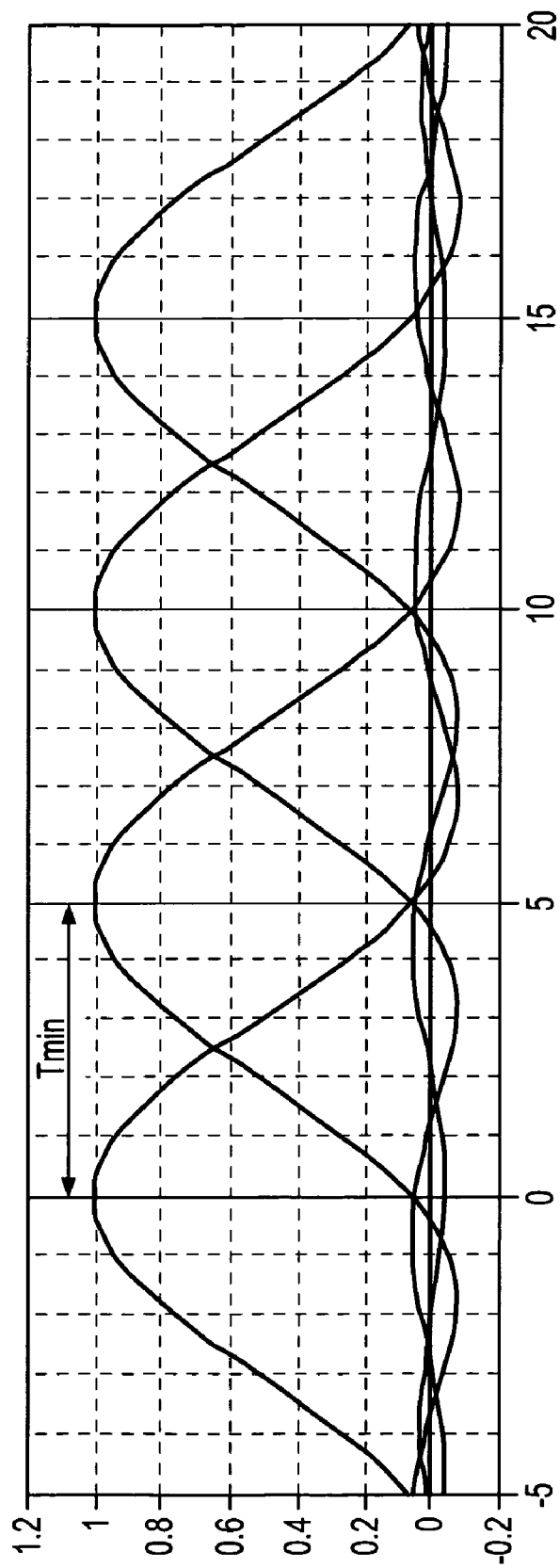
FIG. 5 illustrates an example of one embodiment of the invention showing pulse positions for a conventional four state digital PPM.

Turning now to FIG. 5, illustrated is an example of one embodiment of the invention showing pulse positions for a conventional four state digital PPM. In its simplest implementation, the modulation method covered by the present invention uses a single pulse per group, similar to conventional PPM. The example in FIG. 5 is a compact representation of the allowable pulse positions in a group with four slots with Tmin being the time separation between the allowable pulse peak positions. In PPM only one of these pulses is transmitted in this group and if the demodulation sampling is done at the allowable peak positions, three of the samples will be essentially zero and the correct sample will have amplitude of unity. If sampling during demodulation is not properly synchronized to the peak positions, the amplitude for the "correct pulse" location will start decreasing while the amplitude at a neighboring location will become larger than zero. However, the signal can still be correctly demodulated. If noise is also present in the system, then the probability of incorrect demodulation will be increased due to this timing error. However, if the timing error is small, the degradation is negligible. In principle, if the signal to noise ratio is sufficiently small, the signal can still be successfully demodulated as long as the timing error is less than Tmin/2.

The ability successfully to distinguish between two possible positions of a single pulse even when the pulses are partially overlapped can be used to increase the data density at the expense of signal to noise ratio sensitivity. This increase in data density is achieved by moving the allowable pulse positions closer together in a manner that the skirt of one allowable pulse position overlaps the peaks of the neighboring pulse positions.

Figure 6:
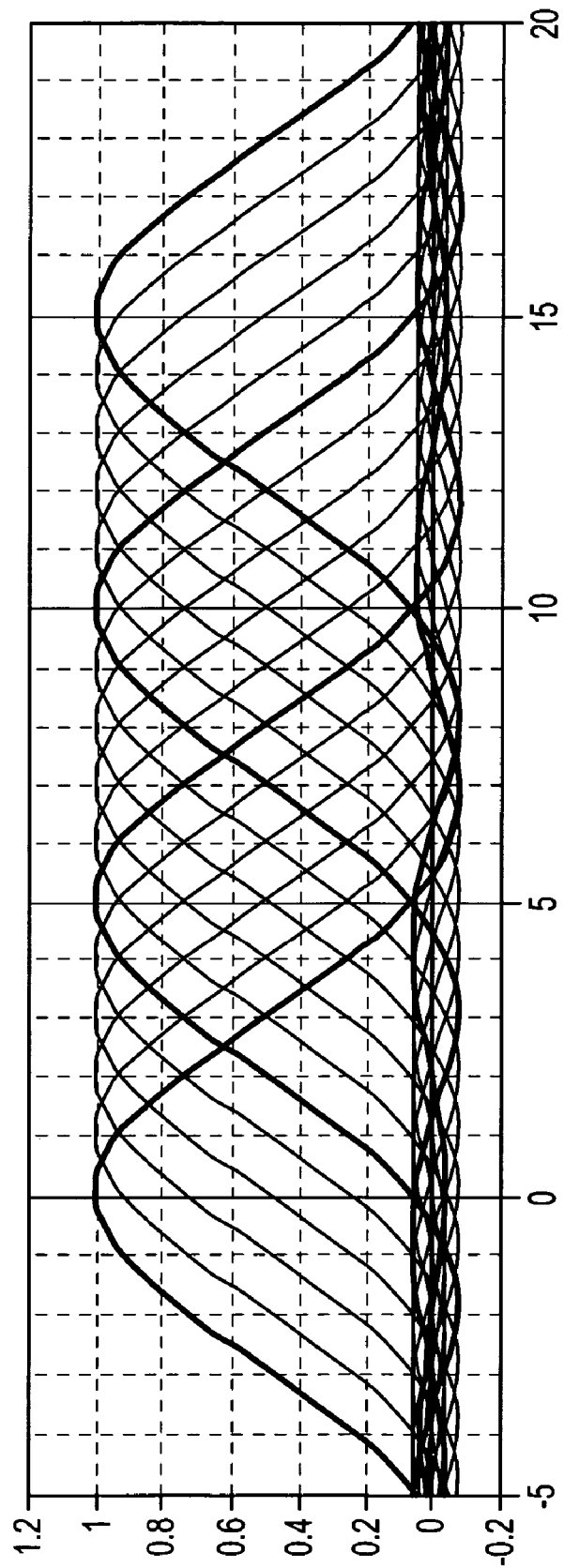
FIG. 6 illustrates an example of an embodiment of the present invention with allowable pulse positions deliberately structured to have significantly overlapping spacing that is smaller than Tmin.

Turning now to FIG. 6, illustrated is an example of an embodiment of the present invention with allowable pulse positions deliberately structured to have significantly overlapping spacing that is smaller than Tmin. The allowable pulse spacing has been reduced to one unit as compared to the five units shown in FIG. 5. In this case, the slot width is equal to Tmin/5 and thus potentially represents a five-fold increase in the number of states. This method for increasing data density is rarely used because of the obvious reduction in the detection margin for distinguishing neighboring pulse positions.

Figure 7:
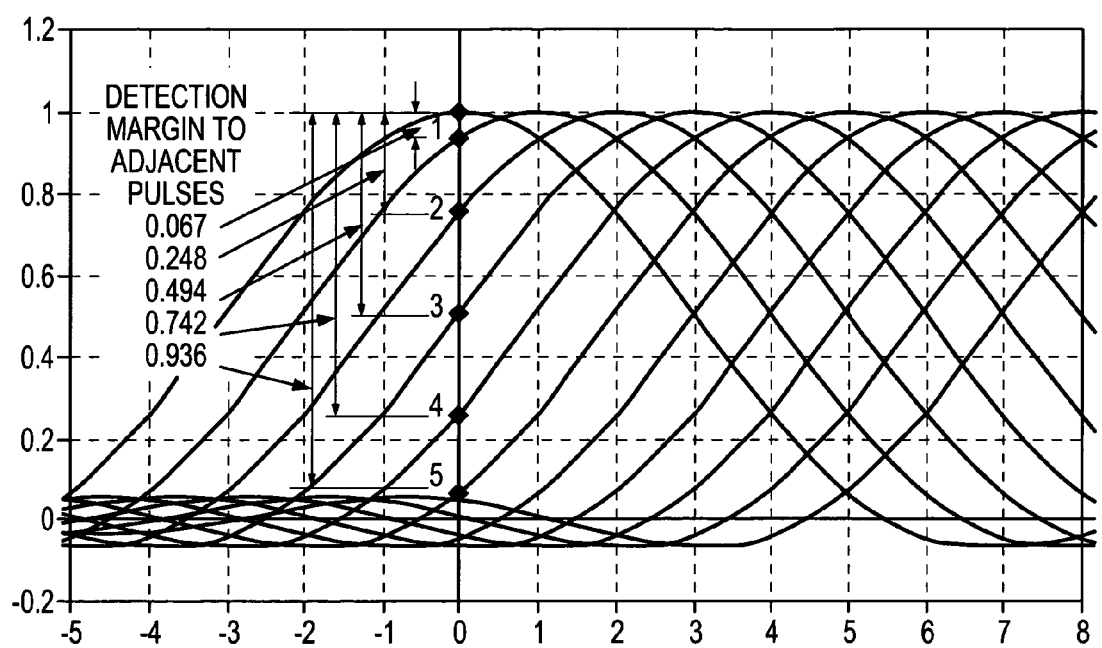
FIG. 7 illustrates the details of one embodiment of pulses with a five-fold increase in the number of states that has a limited detection margin.

Turning to FIG. 7, illustrated are the details of one embodiment of pulses with a five-fold increase in the number of states that has a limited detection margin. To demodulate a signal with the strongly overlapping pulses shown in FIG. 7, it would be necessary to sample the received signal at the peak locations of all possible pulse positions (i.e., at all integer locations on the horizontal axis in FIG. 7). As is evident from FIG. 7, amplitude discrimination is particularly poor with respect to the adjacent pulse positions, but this discrimination increases for the next adjacent pulse, the third adjacent pulse, etc. The present invention provides for a novel modulation format as described herein. The allowable pulses are modified such that each pulse not only has a different time position but also an added phase step between each adjacent pulse. For example, if a phase step of ±90° is added between each adjacent pulse, then the pulse at t=0 (time equals zero) will have 0°, the pulse at t=1 will have ±90°, the pulse at t=2 will have ±180°, the pulse at t=3 will have ±270°, the pulse at t=1 will have ±360°, etc. As will be demonstrated below, the combination of simultaneous phase and time shifted modulation can substantially improve the discrimination between neighboring slots even if the slot spacing is smaller than Tmin.

Figure 8A:
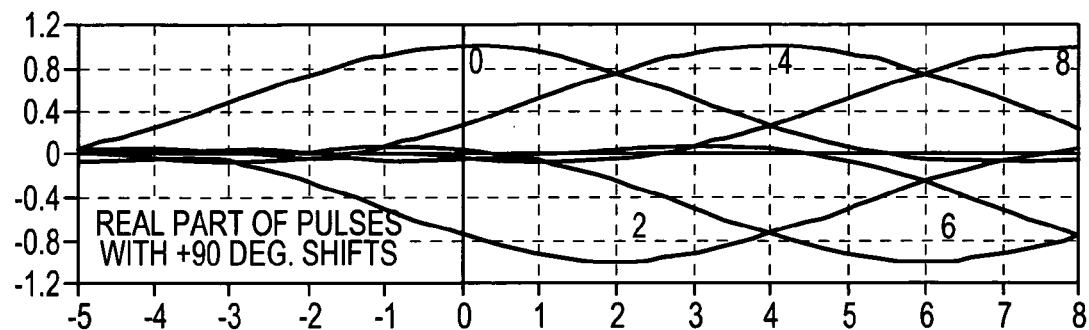
FIGS. 8A and 8B illustrate the real and imaginary parts of overlapping pulses with an added phase shift of +90°.
Figure 8B:
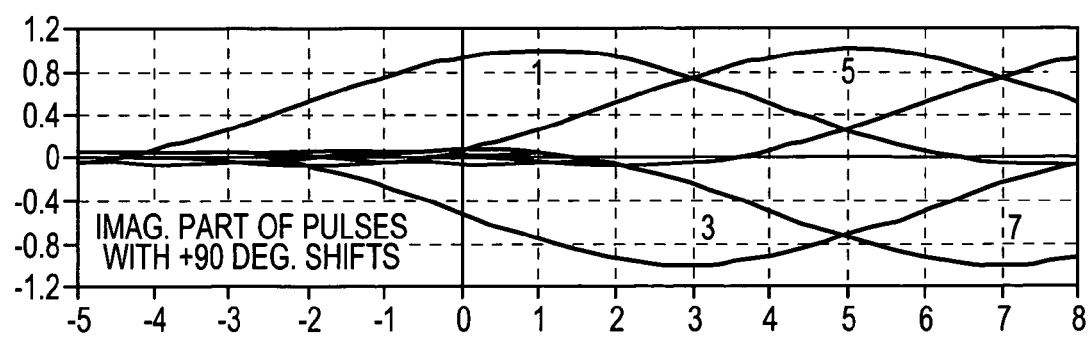

Turning now to FIGS. 8A and 8B, illustrated are the real and imaginary parts of overlapping pulses with an added phase shift of +90°. Because phase multiples of 90° are used in the illustrated embodiment, the odd numbered pulses (1, 3, 5, etc.) have real parts equal to zero and the even numbered pulses have imaginary parts equal to zero.

To demodulate the signal in FIG. 8, it would be necessary to sample the real part of the received signal at the peak locations (t=0, 1, 2, etc.), as well as shifting the phase of the sampling signal from one time slot to the next such that it would agree with the expected phase of a pulse if it should occur at that slot location.

In general, a wide range of phase angles can be used, many of which can give equal or better performance than this particular 90° case. For example, a stepping angle could vary around the 90° value by more than ±20° without any significant degradation in the case of slot separations of Tmin/5.

Figure 9:
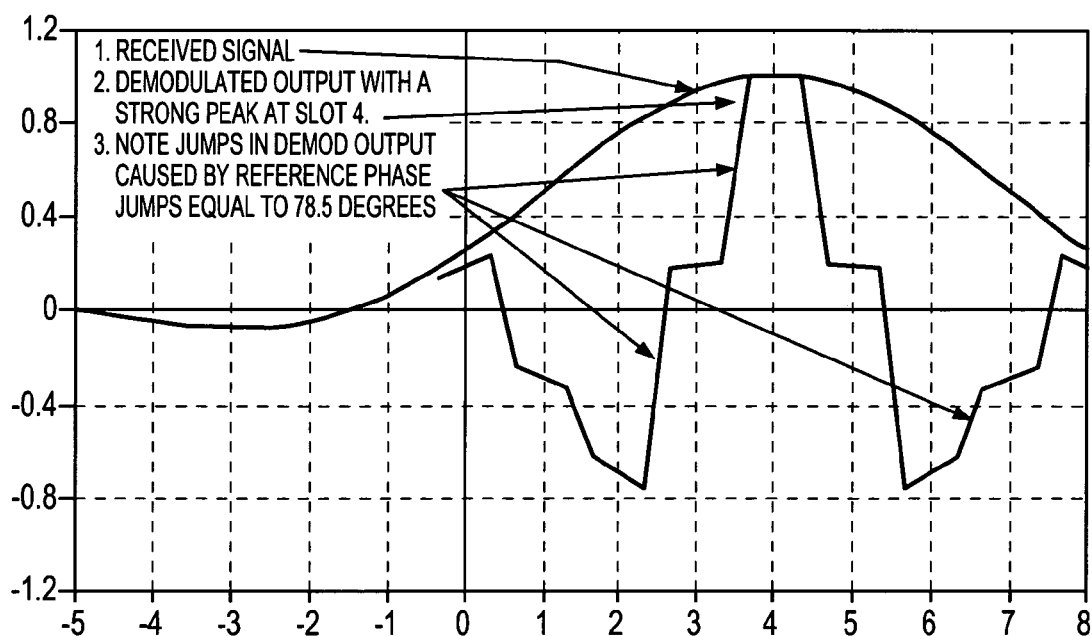
FIG. 9 illustrates an embodiment of the invention where a phase increment other than 90° is used with substantially improved discrimination between the correct state and the neighboring states where the allowable pulse spacings are Tmin/5 and a 78.5° phase difference between adjacent allowed states is used.

Turning now to FIG. 9, illustrated is an embodiment of the invention where a phase increment other than 90° is used with substantially improved discrimination between the correct state and the neighboring states where the allowable pulse spacings are Tmin/5 and a 78.5° phase difference between adjacent allowed states is used. In FIG. 9 a phase increment other than 90° was chosen to illustrate the substantially improved discrimination between the correct state and the neighboring states for a wide variety of phase angles. Even more important, FIG. 9 illustrates a dramatic improvement as compared to the identical allowed pulse spacing without phase shifts as was illustrated earlier in FIG. 7. The cases of FIG. 7 and FIGS. 8 and 9 have the identical approximate five-fold improvement in the number of states as compared to the more conventional PPM with allowable pulse spacing of Tmin. But, without the phase shifts (FIG. 7) the detection minimum margin is only 0.067 while, with the phase shifts (FIGS. 8&9) the detection margin to adjacent states is now 0.81 which is very similar to the more conventional PPM which has a detection margin approaching unity.

In the embodiment of the present invention illustrated in FIG. 9, pulse modulation can be characterized by simultaneously shifting both the phase and the time location of a pulse communication signal in a known manner. This embodiment will be henceforth designated as simultaneous phase and time shift keying (PTSK) where keying is the equivalent of modulation. While the discussion herein only considered uniformly spaced time shifts and uniformly spaced phase shifts, those of ordinary skill in the pertinent art will understand that non-uniform spacing of either the time or phase shifts (or both) is within the scope of the present invention.

In this embodiment, a data stream to be transmitted: (1) is partitioning into one or more separate sample values; (2) at least one pulse is used to transmit a given sample value; (3) at least one pulse is transmitted in a span of time that is divided into time slots that are nominally, but not necessarily, adjacent; (4) the collection of time slots comprising the span of time constitutes a group of slots; (5) each slot has a unique phase shift and a unique time location and (6) at least one pulse is contained within the group of slots in a predetermined manner to represent the information contained in the separate sample value. Groups can vary in the number of slots and/or in the number of occupied slots and still be within the scope of the present invention. Also, a single group can be defined such that it only has a fixed number of occupied slots or, alternatively, it might allow for a varying number of occupied slots. Also, a single data message could include more than one type of group (for example the header might be one type of group, the actual data a second type of group, and an error detection/correction word might be of a third type). All of these variants have particular usefulness in SAW RFID tags and are all within the intended scope of the present invention.

In another embodiment of the present invention a combined multi-pulse group keying and simultaneous phase and time shift keying (MPG/PTSK) can be implemented. In the earlier illustrations of MPGK, multiple pulses were used in one group but Tmin separated the pulse positions. Similarly, in the earlier illustrations of PTSK only one pulse per group (like conventional PPM) was used, but the allowable pulse separations were significantly smaller than Tmin. Combining the two types requires attention to certain subtle details. In the MIPGK case, two adjacent slots can both be occupied because, as described above, the skirt of one pulse does not overlap the peak of any neighboring pulse (the same as for conventional PPM, as shown in FIG. 5). However, if two adjacent or closely neighboring slots were allowed to be simultaneously occupied when using strongly overlapping pulses (as in FIG. 7), the potential for strong inter-symbol interference between pulses would exist and could result in almost total cancellation between the two where a significant phase shift between pulses is present (e.g., FIGS. 8 and 9).

This potential interference must be addressed if the MPGK modulation method is to be successfully combined with the PTSK method.

A primary method for solving the interference problem is to impose a minimum pulse spacing rule when using MPGK along with PTSK. One generally useful rule is that while the allowable pulse positions can have time separations that are significantly smaller than Tmin, in a specific waveform any two actual pulses included in that waveform must always have a minimum spacing equal or greater than Tmin.

Figure 10:
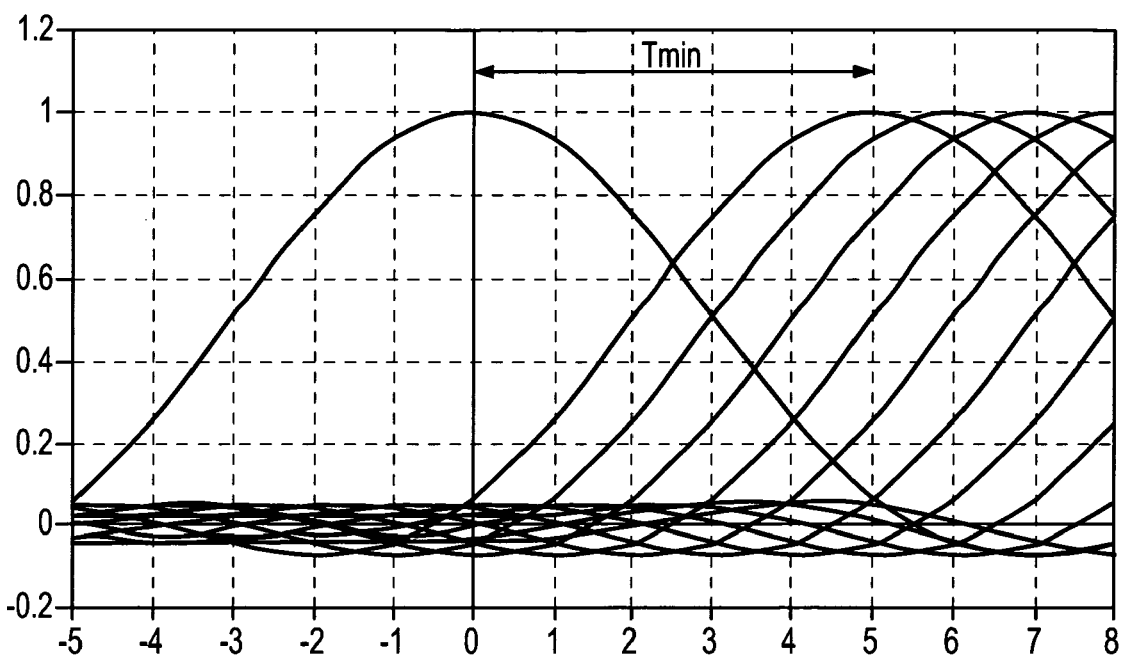
FIG. 10 illustrates an embodiment of a minimum pulse spacing rule that allows using MPGK along with PTSK.

Turning to FIG. 10, illustrated is an embodiment of a minimum pulse spacing rule that allows using MPGK along with PTSK. In this example, one pulse in the waveform is selected to occur at t=0 and, by the minimum pulse spacing rule, the next pulse is excluded from positions t=1, 2, 3 and 4, but is allowed to occur at positions t=5, 6, 7, etc. (Note: the PTSK phase shifts between pulse slots are omitted for clarity in this FIG. 10.) Note that at least four pulse slots had to be skipped between selected pulses where Tmin is equal to five slots. In a more general case, if a slot width equals Tmin/N then a skip factor can be defined that will equal N−1. Larger skip factors can be used and could be beneficial in certain cases (for example in operating environments with strong outside interference). Somewhat smaller skip factors could also be beneficial in other cases but it appears that assuring a minimum spacing rule equal to Tmin will likely be the best choice in most circumstances.

Another method for solving the potential interference problem of two adjacent slots being occupied when PTSK is combined with MPGK is based on the orthogonality between adjacent slots that arises if the phase shift between slots is ±90° (see the example given earlier in FIG. 7). If the phase is sufficiently close to ±90°, then a pulse in any given slot will not interfere with either of the two adjacent slots. In this case, all odd numbered slots are totally independent of all even numbered slots. However, a pulse can still interfere with its $2^{nd}$, $4^{th}$, $6^{th}$, etc. nearest neighbors if the spacing of these neighbors is closer than Tmin. In this special "orthogonal nearest neighbor" case, a useful method for analyzing the options is to divide the slots into two intertwined sub-groups (I and Q). Then, if necessary, the Tmin minimum spacing rule illustrated in FIG. 10 is separately applied to each sub-group.

This embodiment of the invention of using PTSK combined with MPGK is generally characterized by a significant overlap between the pulses in neighboring slots. Variants of this embodiment can be derived from the earlier descriptions of PTSK and MPGK.

However, any combination of PTSK and MPGK should consider the need for providing a means to avoid the potential inter-symbol interference effects that may arise when using pulses that have significant overlap with neighboring slots. Since this method combines the characteristics of two embodiments previously described, it can appropriately be called MPG/PTSK (i.e., combined multi-pulse groups with simultaneous phase and time shift keying).

To those of ordinary skilled in the pertinent art, it is evident that a wide range of other combinations of phase shifts and minimum spacing rules are within the intended scope of the present invention. For example, it is possible to allow one or more pulses with separations of less than Tmin. In general, a variety of optimizations are possible using combinations of the variables of (1) phase shift between adjacent slots; (2) integer or non-integer divisions of Tmin for defining slot time spacing; (3) a host of different "skip" rules which may even cross the slots of a group; (4) using number systems (or combinations of number systems) other than binary (since the number of states per group are not necessarily equal to powers of two); (5) using a mapping in which the number of "data states" is less than the total allowable states in one group for purposes of handling exceptions, error detection/correction, improved immunity to transmission impairments, etc.; and (6) other possible variations such as pulse amplitude.

Figure 11:
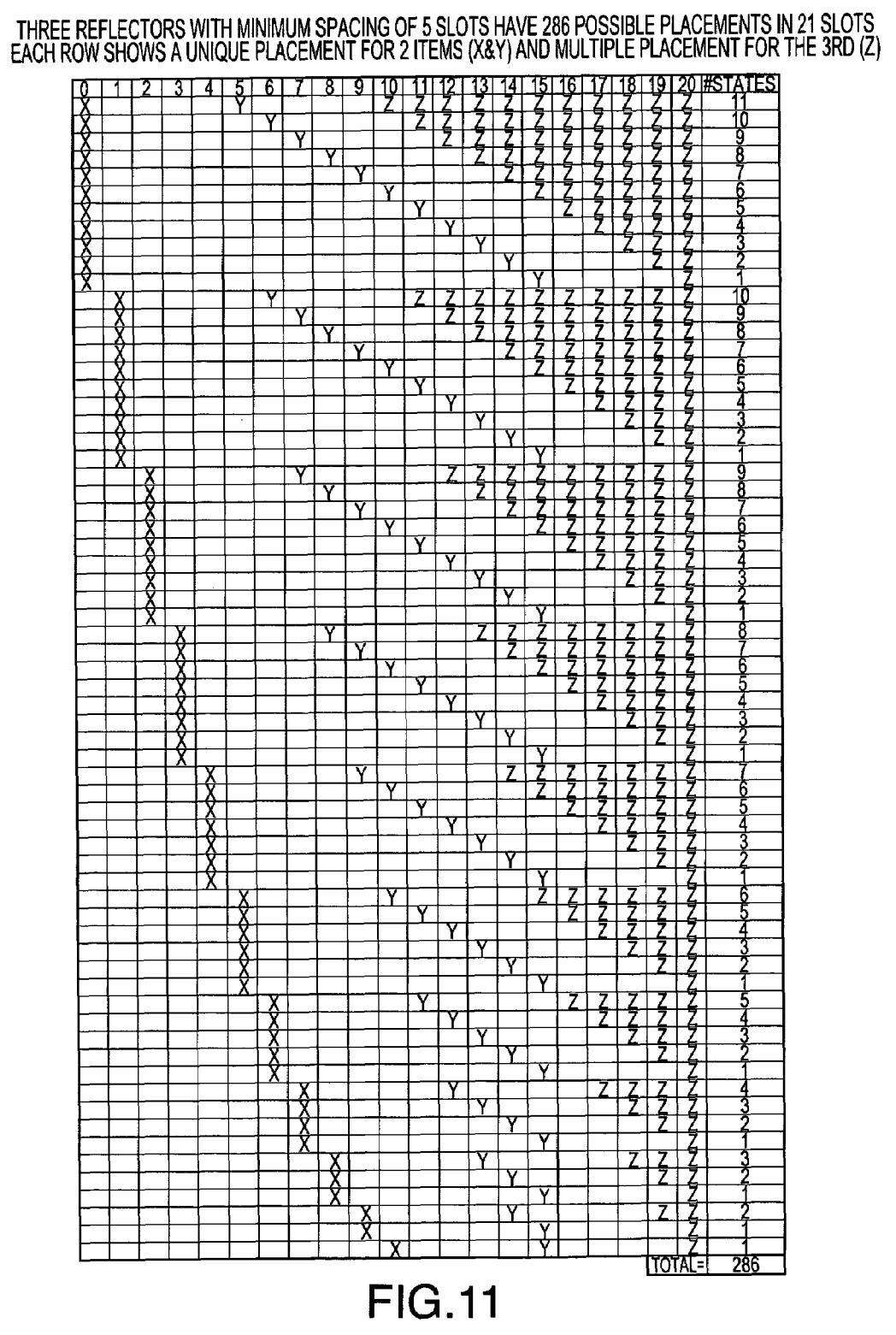

Turning now to FIG. 11, illustrated is a table showing the 286 possible states that exist when three reflectors are used in a group of 21 Slots having a skip factor of four. This is an example of a single group where a SAW RFID tag has three reflectors per group, with 21 slots per group, a skip factor of four, and a phase increment between adjacent slots ranging from 75° to 105°. The phase increment between adjacent slots is in the same range as was described earlier in conjunction with FIGS. 8 and 9. Interference between neighboring pulses due to the five-fold overlap between neighboring pulses is avoided by using a skip factor of four. It is evident that 286 states are sufficient to encode the 256 states that correspond to 8 bits of data. This particular variant has a group size that is approximately 25% larger that the conventional PPM method illustrated in FIG. 4, but it achieves eight data bits which is four times greater than the two bits of the example illustrated in FIG. 4. Moreover, it achieves eight bits with only three SAW reflectors instead of four, which would be required for eight data bits with conventional PPM.

Turning now to FIG. 12, illustrated are tables showing two sub-groups of states from a SAW RFID tag with four reflectors per group, 20 slots per group, a phase increment between adjacent slots ±90° with division into two interleaved sub-groups of ten slots each. The two sub-groups are designated as I and Q for sub-groups based on either in-phase or quadrature slots. Further within each I or Q sub-group the minimum pulse spacing is three (i.e. skip factor of 2) and only one reflector of each specific phase is allowed per sub-group. (Note that in FIG. 12 the possible reflected pulses in even numbered slots are 180 degrees out of phase with the possible reflected pulses from odd numbered slots.) When the I and Q sub-groups are considered together, a total of 256 combinations are possible which is sufficient to encode 8 binary data bits.

Turning back to FIG. 3, a unique return signal is generated by locating the reflectors 320 on the surface 305 in a group 340 of slots 330 arranged by both pulse position and phase position. The number of slots 330 is dependent on the encoding system being used. In the illustrated embodiment, slots 330 are arranged in phase quadrature to correspond to a +I 336, a +Q 337, a −I 338 and a −Q 339 phase of a SAW return signal. The first four slots 330 of the first group 340 are designated by numbering while in the second group 340 each slot 330 is labeled with its respective phase position. In other embodiments different phase positions may be used, which different phase positions would require slots 330 to be arranged accordingly. Of course any number of phase positions and any number of slots 330 are well within the intended scope of the present invention. example is quite similar to the previous example in which four distinct phase states are divided into two sub-groups of ten slots each. Each sub-group can be treated as having a skip factor of one. The table gives the states corresponding to one such sub-group. The only difference between this example and the previously example is that the two in-phase reflectors (+I & −I) can be of either the same sign or of opposite signs. The major advantage of this example is that with 36 states per sub-group, a total of 10 bits per group can be obtained, which is better than the eight bits in the previous example. The disadvantages of this example are possibly worse spurious reflections than the previous example, and the possibly enhanced sensitivity to pulse smearing effects.

The present invention therefore introduces the broad concept of employing both phase and pulse position modulation and/or the use of multiple pulse combinations to dramatically increase the amount of data that a SAW identification tag 300 can contain. This data capacity permits a SAW identification tag 300 to contain a number that is unique to that specific SAW identification tag 300, e.g., a globally unique number, which allows SAW identification tags 300 to be used to identify and reliably track an unprecedented number of objects. This unique numbering capability advantageously effects object (or asset) tracking, and makes a global object tracking system possible, particularly when harnessed with the power of the Internet.

The large data capacity of SAW identification tags 300 permits, in one embodiment of the invention, data to be encoded thereon with respect to an associated object. Thus, a SAW identification tag 300 can be advantageously affixed to nearly any object, which may be a machine part, a package, supply item, animal, or other item and the information can be used to identify and classify the object.

In yet another embodiment of the present invention, the number includes an error detection portion. The error detection portion may further be capable of error correction to at least some extent. Of course, error detection or correction is not required in the broad scope of the present invention.

Figure 14:
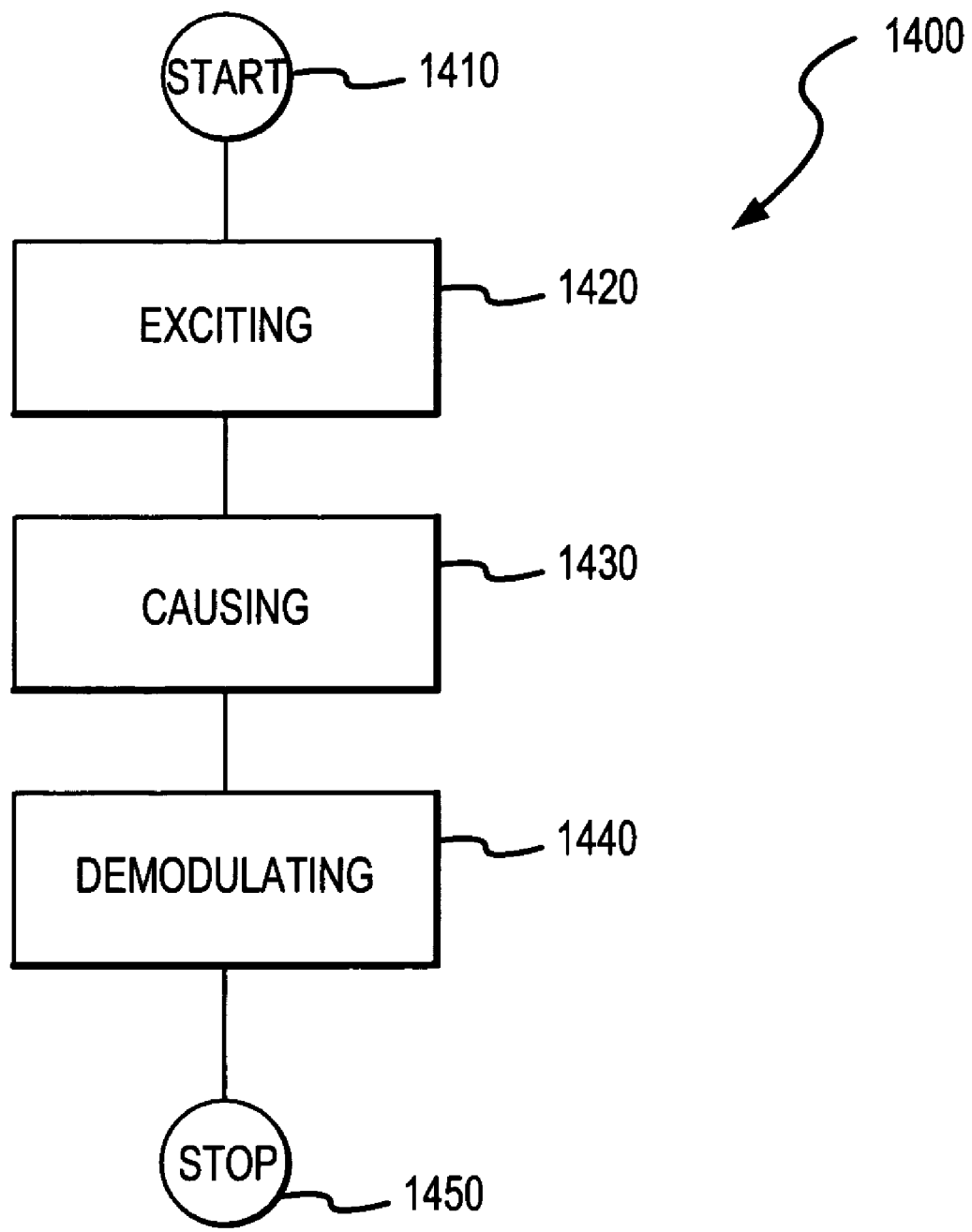
FIG. 14 illustrates a block diagram of a method of operating a SAW identification tag carried out according to the principles of the present invention.

Turning now to FIG. 14, illustrated is a block diagram of a method 1400 of operating a SAW identification tag. The method commences with a start step 1410. The method 1400 provides for exciting a SAW transducer located on a piezoelectric substrate to create a SAW in an exciting step 1420. In a causing step 1430, the SAW is caused to reflect from reflectors distributed among a group of slots in a predetermined manner in accordance with the broad concept of employing both phase and pulse position modulation and/or the use of multiple pulse combinations to encode desired data onto the tag. In a demodulating step 1440, reflected portions of the SAW are decoded to yield a number or other data encoded onto the SAW identification tag. The method concludes with an end step 1450. Several embodiments of a method of operating a SAW identification tag are provided for by the invention. The descriptions of the various embodiments of a SAW identification tag set forth above are sufficiently detailed so as to enable one of ordinary skill in the pertinent art to understand and practice all such embodiments.

Figure 15:
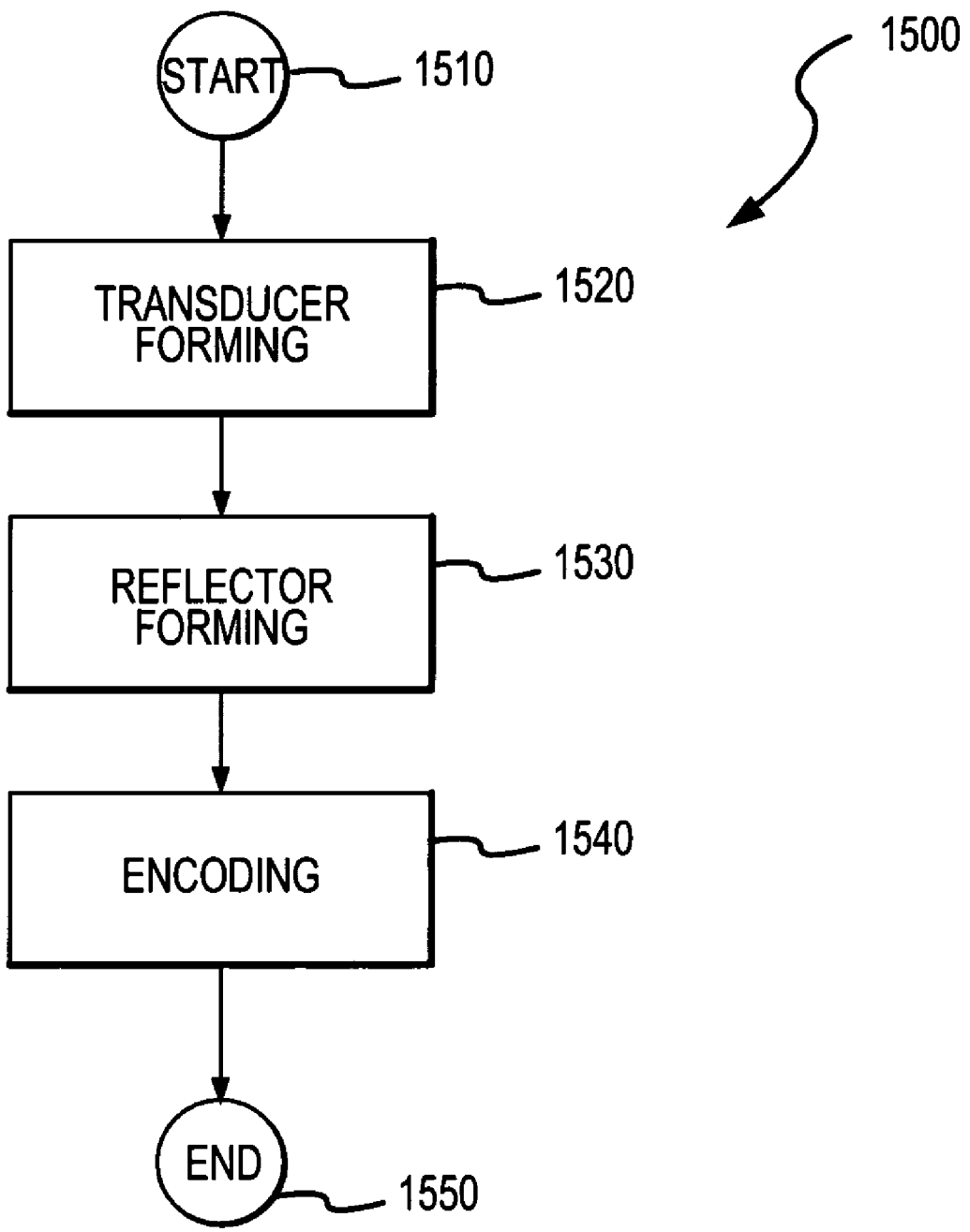
FIG. 15 illustrates a block diagram of a method of manufacturing a SAW identification tag carried out according to the principles of the present invention.

Turning now to FIG. 15, illustrated is a block diagram of a method 1500 of manufacturing a SAW identification tag. The method 1500 commences with a start step 1510. In a transducer forming step 1520, a SAW transducer is formed on a piezoelectric substrate. In one embodiment of the method 1500, the transducer is configured to produce a SAW having a frequency of between two and three gigahertz. In a reflector forming step 1530, reflectors are formed with predetermined spatial positions, phase positions, and reflection amplitudes to constitute slots arranged into at least one group of slots plus other reflectors which may be desired such as framing reflectors. In a reflector encoding step 1540, a particular set of reflectors that correspond to encoded tag data are formed such that only the needed reflectors are present on the surface and all slots which should not contain reflectors are empty or otherwise deactivated. While FIG. 15 lists the three steps 1520, 1530, and 1540 in order, these steps can also be done in any other order; or in a parallel combination; or concurrently as the fabrication process permits, either in a subtractive (e.g. etching) or additive (e.g. depositing) mode.

In one embodiment of the method 1500, at least some of the reflectors are single strips of conductive material. In another embodiment of the method 1500, adjacent slots are arranged in quadrature phase. In another embodiment of the method at least four groups are provided and the encoded number is at least 32 bits long. In yet another embodiment, twelve groups are provided for and the number is at least 96 bits long. In still another embodiment, the encoded data is unique to the SAW identification tag while yet another embodiment provides for the data to contain data pertaining to an object associated with the SAW identification tag. The data in another embodiment includes an error detection portion. In another embodiment the data includes general alpha-numeric information consisting of alphabetic portions and/or numeric portions.

In one embodiment of the method 1500, the reflector forming step 1520 is carried out such that groups are separated by dead spaces. Framing reflectors can also be formed at this step. After all required transducers and reflectors are formed and encoded, the method concludes with an end step 1550.

The present invention has been described in terms of a SAW identification tag based on a single transducer plus SAW reflective structures. Those of ordinary skill in the pertinent art should understand that various changes, substitutions and alterations are possible all of which will be within the intended scope of the present invention. These include, without being limited to: (1) coded SAW devices can be implemented using multiple acoustic tracks and/or multiple SAW transducers; (2) the SAW propagation path may be folded in a variety of ways to achieve a smaller device area or other purposes; (3) the transducer(s) may include use of unidirectional SAW transducers; (4) the phase positions of reflector structures may be implemented using fine grain spatial adjustments of reflector elements of a size that is a small fraction of a SAW wavelength on the device surface; (5) the reflectors may be arranged in conjunction with more than one SAW transducer such that the device input may be either totally or partially separated from the device output between the more than one SAW transducers; (6) instead of using encoded reflectors in the SAW device, some or all of the encoding maybe accomplished using well known SAW transducer filter implementations of specified impulse responses; (7) the reflective taps and/or transducer taps that are used to encode the data can use a variety of known methods for weighting the desired amplitude based on width of strips, thickness (or depth) of strips, number of strips, and varying overlap of strips; (8) the SAW transducer can also provide functions such as band shaping, phase compensation and other filter functions; and (9) any of a number of other elements of SAW technology.

The broad classes of modulation methods described herein are described in connection with SAW identification tags. Such modulation methods can also be used in connection with fields other than SAW identification tags such as, without limitation, (1) identification tags based on technologies other than SAW technology; (2) SAW devices for purposes other than identification tags; and (3) using the modulation methods described herein without using the SAW technology and for purposes other than identifications tags.

Although the present invention has been described in detail, those skilled in the art should understand that they can make various changes, substitutions and alterations herein without departing from the spirit and scope of the invention in its broadest form.

What is claimed is:

1. A surface acoustic wave (SAW) identification tag, comprising:

a piezoelectric substrate having a SAW transducer located thereon;

a group of reflector locations on said substrate, each of said reflector locations arranged by both a pulse position and a phase; and a number of reflectors distributed among said reflector locations such that said reflectors encode a number simultaneously by both said pulse position and said phase.

2. The SAW identification tag as recited in claim 1 wherein said phase is in quadrature.

3. The SAW identification tag as recited in claim 1 further comprising a framing reflector located between said SAW transducer and said group of reflector locations.

4. The SAW identification tag as recited in claim 1 further comprising a plurality of said group of reflector locations separated by dead spaces.

5. The SAW identification tag as recited in claim 4 wherein said plurality is at least four and said number is at least 32 bits long.

6. The SAW identification tag as recited in claim 1 wherein said number is at least 8 bits long.

7. The identification tag as recited in claim 1 wherein at least one of said reflectors is a single strip of conductive material.

8. The identification tag as recited in claim 1 wherein said number is unique to said tag.

9. The identification tag as recited in claim 1 wherein said number contains data pertaining to an object associated with said tag.

10. A surface acoustic wave (SAW) identification tag, comprising:

a piezoelectric substrate having a SAW transducer located thereon;

a group of reflector locations on said substrate, each of said reflector locations arranged by both a pulse position and a phase; and a number of reflectors distributed among said reflector locations such that said reflectors encode a number simultaneously by both said pulse position and said phase wherein said number includes an error detection portion.

11. A method of operating a surface acoustic wave (SAW) identification tag, comprising:

exciting a SAW transducer located on a piezoelectric substrate to create a SAW;

causing said SAW to reflect from reflectors distributed among a group of reflector locations on said substrate, each of said reflector locations arranged by both a pulse position and a phase; and demodulating reflected portions of said SAW to yield a number encoded simultaneously by both said pulse position and said phase.

12. The method as recited in claim 11 wherein said reflectors are arranged wherein said phase is in quadrature.

13. The method as recited in claim 11 further comprising causing said SAW to reflect from a framing reflector located between said SAW transducer and said group of reflector locations.

14. The method as recited in claim 11 further comprising causing said SAW to reflect from reflectors distributed among a plurality of said group of reflector locations separated by dead spaces.

15. The method as recited in claim 14 wherein said plurality is at least four and said number is at least 32 bits long.

16. The method as recited in claim 11 wherein said number is at least 8 bits long.

17. The method as recited in claim 11 wherein at least one of said reflectors is a single strip of conductive material.

18. The method as recited in claim 11 wherein said number is unique to said tag.

19. The method as recited in claim 11 wherein said number contains data pertaining to an object associated with said tag.

20. A method of operating a surface acoustic wave (SAW) identification tag, comprising:

exciting a SAW transducer located on a piezoelectric substrate to create a SAW;

causing said SAW to reflect from reflectors distributed among a group of reflector locations on said substrate, each of said reflector locations arranged by both a pulse position and a phase; and demodulating reflected portions of said SAW to yield a number encoded simultaneously by both said pulse position and said phase wherein said number includes an error detection portion.

21. A method of manufacturing a surface acoustic wave (SAW) identification tag, comprising:

forming a SAW transducer on a piezoelectric substrate; and depositing reflectors among reflector locations arranged in a group on said substrate, each of said reflector locations having both a pulse position and a phase, said reflectors simultaneously encoding a number by both pulse position and phase.

22. The method as recited in claim 21 wherein said reflectors are arranged wherein said phase is in quadrature.

23. The method as recited in claim 21 further comprising depositing a framing reflector between said SAW transducer and said group.

24. The method as recited in claim 21 further comprising a plurality of said groups separated by dead spaces.

25. The method as recited in claim 24 wherein said plurality of groups is at least four and said number is at least 32 bits long.

26. The method as recited in claim 21 wherein said number is at least 8 bits long.

27. The method as recited in claim 21 wherein at least one of said reflectors is a single strip of conductive material.

28. The method as recited in claim 21 wherein said number is unique to said tag.

29. The method as recited in claim 21 wherein said number contains data pertaining to an object associated with said tag.

30. A method of manufacturing a surface acoustic wave (SAW) identification tag, comprising:

forming a SAW transducer on a piezoelectric substrate; and depositing reflectors among reflector locations arranged in a group on said substrate, each of said reflector locations having both a pulse position and a phase, said reflectors simultaneously encoding a number by both pulse position and phase wherein said number includes an error detection portion.

31. A surface acoustic wave (SAW) identification tag, comprising:

a piezoelectric substrate having a SAW transducer located thereon;

a group of reflector locations on said substrate, each of said reflector locations arranged by both a pulse position and a phase wherein said phase is defined relative to neighboring reflector locations; and a number of reflectors distributed among said reflector locations such that said reflectors encode a number simultaneously by both said pulse position and said phase.

32. A surface acoustic wave (SAW) identification tag, comprising:

a piezoelectric substrate having a SAW transducer located thereon;

a group of reflector locations on said substrate, each of said reflector locations arranged by both a pulse position and a phase wherein non-uniform spacing is utilized for said pulse position; and a number of reflectors distributed among said reflector locations such that said reflectors encode a number simultaneously by both said pulse position and said phase.

33. A surface acoustic wave (SAW) identification tag, comprising:

a piezoelectric substrate having a SAW transducer located thereon;

a group of reflector locations on said substrate, each of said reflector locations arranged by both a pulse position and a phase wherein non-uniform spacing is utilized for said phase; and a number of reflectors distributed among said reflector locations such that said reflectors encode a number simultaneously by both said pulse position and said phase.

34. A surface acoustic wave (SAW) identification tag, comprising:

a piezoelectric substrate having a SAW transducer located thereon;

a group of reflector locations on said substrate, each of said reflector locations arranged by both a pulse position and a phase wherein non-uniform spacing is utilized for both said pulse position and said phase; and a number of reflectors distributed among said reflector locations such that said reflectors encode a number simultaneously by both said pulse position and said phase.

35. A surface acoustic wave (SAW) identification tag, comprising:

a piezoelectric substrate having a SAW transducer located thereon;

a group of reflector locations on said substrate, each of said reflector locations arranged by both a pulse position and a phase; and a number of reflectors distributed among said reflector locations such that said reflectors encode a number simultaneously by both said pulse position and said phase wherein a minimum reflector spacing rule is followed when determining the placement of said reflectors distributed among said reflector locations.

36. A surface acoustic wave (SAW) identification tag, comprising:

a piezoelectric substrate having a SAW transducer located thereon wherein said SAW transducer has a unidirectional character;

a group of reflector locations on said substrate, each of said reflector locations arranged by both a pulse position and a phase; and a number of reflectors distributed among said reflector locations such that said reflectors encode a number simultaneously by both said pulse position and said phase.

37. A surface acoustic wave (SAW) identification tag, comprising:

a piezoelectric substrate having a SAW transducer located thereon;

a group of reflector locations on said substrate, each of said reflector locations arranged by both a pulse position and a phase wherein said phase of reflector locations is implemented using fine grain spatial adjustment of reflector elements by a fraction of a SAW wavelength on the device surface; and a number of reflectors distributed among said reflector locations such that said reflectors encode a number simultaneously by both said pulse position and said phase.

* * * * *